United States Patent

Kasperkovitz et al.

[11] Patent Number: 5,493,250
[45] Date of Patent: Feb. 20, 1996

[54] ADJUSTABLE RESISTANCE DEVICE INCLUDING FIRST AND SECOND ARRANGEMENTS OF A RESISTOR AND A POSITIVE-FEEDBACK TRANSCONDUCTOR, AND A CONTROL CIRCUIT FOR CONTROLLING THE RESISTANCES OF THE FIRST AND SECOND ARRANGEMENTS

[75] Inventors: Wolfdietrich G. Kasperkovitz; Hendricus C. De Ruyter, both of Eindhoven, Netherlands

[73] Assignee: U.S. Philips Corporation, New York, N.Y.

[21] Appl. No.: 393,752

[22] Filed: Feb. 24, 1995

[30] Foreign Application Priority Data

Mar. 7, 1994 [EP] European Pat. Off. .............. 94200557

[51] Int. Cl.[6] .................................................. G06G 7/12
[52] U.S. Cl. .......................... 327/563; 327/560; 330/256; 330/289; 330/296
[58] Field of Search .................................. 327/560, 561, 327/562, 563, 552; 330/256, 289, 296; 455/234.1, 240.1

[56] References Cited

U.S. PATENT DOCUMENTS

| 4,147,989 | 4/1979 | Brolde | 327/560 |
|---|---|---|---|
| 4,456,886 | 6/1984 | Nishioka et al. | 330/256 |
| 4,873,492 | 10/1989 | Myer | 330/86 |
| 5,030,925 | 7/1991 | Taylor | 330/308 |
| 5,220,686 | 6/1993 | Kasperkovitz et al. | 455/234.1 |
| 5,394,112 | 2/1995 | Alini et al. | 330/256 |

Primary Examiner—Timothy P. Callahan
Assistant Examiner—Kenneth B. Wells
Attorney, Agent, or Firm—Edward W. Goodman

[57] ABSTRACT

An adjustable resistance device having a first parallel arrangement (1) of a first resistor and a first positive-feedback transconductor is provided with a control circuit (20) for controlling the controllable resistance section in the first parallel arrangement (1), which control circuit (20) includes a control loop including a second parallel arrangement (2) which is a copy of the first parallel arrangement (1). The control circuit (20) controls the controllable section of the second parallel arrangement (2) in such a manner that the negative resistance value formed by a second transconductor is substantially equal in magnitude to the resistance value of a second resistor, so that the second parallel arrangement (2) is bistable in the transition range. By selecting the positive resistance value in the first parallel arrangement (1) to be a factor smaller than the negative resistance value, which factor can be realized accurately in an integrated circuit, it is possible to obtain a higher effective resistance with a smaller spread.

20 Claims, 3 Drawing Sheets

5,493,250

ADJUSTABLE RESISTANCE DEVICE INCLUDING FIRST AND SECOND ARRANGEMENTS OF A RESISTOR AND A POSITIVE-FEEDBACK TRANSCONDUCTOR, AND A CONTROL CIRCUIT FOR CONTROLLING THE RESISTANCES OF THE FIRST AND SECOND ARRANGEMENTS

BACKGROUND OF THE INVENTION

1. Field of the Invention

The invention relates to a adjustable resistance device comprising a first parallel arrangement of a first resistor and a first positive-feedback transconductor, which parallel arrangement has a control input coupled to an output of a control circuit.

Such an adjustable resistance device is suitable for general purposes and is particularly suitable for realizing resistance values which are comparatively insusceptible to expansion of the resistance tolerance range.

2. Description of the Related Art

The parallel arrangement of a resistor with a positive-feedback transconductor is known, inter alia from U.S. Pat. No. 5,220,686, where it is included in the resistance-determining section of a resonance amplifier. By constructing the resistance-determining section as a parallel arrangement of a first resistor and a first positive-feedback transconductor, the effective resistance can be increased since the first positive-feedback transconductor functions as a negative resistance arranged in parallel with the first resistor. By selecting the value of this negative resistance to be a factor k (k>1) larger than the value of the first resistor the effective resistance of the parallel arrangement of the first resistor and the first positive-feedback transconductor increases by a factor M=(k/k−1). This has the advantage of a higher effective resistance without a large chip area or a higher supply voltage being required. In the resonance amplifier the transconductance of the transconductor, and hence the effective resistance value in the parallel arrangement, is controlled by means of a control circuit.

However, the resistance increase by means of a parallel-connected negative resistance is subject to the restriction that in the case of an increase of the effective resistance by a factor M, a deviation in the positive or negative resistance results in a deviation in the effective resistance which is M times as large. For very high effective resistance values, which are attended with a very high value for M, a comparatively small relative tolerance range of the positive or the negative resistance value will result in a substantial tolerance range in the effective resistance value. This means that an external adjustment of the effective resistance value is necessary.

SUMMARY OF THE INVENTION

It is an object of the invention to provide a control circuit for the adjustment of a resistance value, which circuit appreciably reduces the susceptibility of this adjustment to expansion of the resistance tolerance range, which enables very high resistance values to be obtained without external adjustments in the case of integration.

To this end, according to the invention, an adjustable resistance device of the type defined in the opening paragraph is characterized in that the control circuit comprises a control loop which includes:

arranged between a first node and a second node, a second parallel arrangement of a second resistor and a second positive-feedback transconductor, which second parallel arrangement has a control input, a comparator circuit having a first and a second input coupled to the first node and the second node, respectively, and having an output which forms the output of the control circuit and which is also coupled to the control input of the second parallel arrangement, the second parallel arrangement differs from the first parallel arrangement in at least one of the following aspects:

the first resistor is smaller in value than the second resistor, the transconductance of the first transconductor is smaller than the transconductance of the second transconductor.

The invention is based on the recognition of the tact that in an integrated circuit, the relative tolerance range in component values of two components of the same kind (transistors or resistors) is substantially equal in magnitude and direction and this fact can be utilized to realized a replica of the relevant component, which replica can be included in a control circuit adapted specifically to adjust the operating point of the component.

When the step in accordance with the invention is applied, the negative resistance value formed by the second positive-feedback transconductor in the control circuit will be equalized to the resistance value of the second resistor by control of the transconductance of the second transconductor or by control of the resistance value of the second resistor. The second parallel arrangement of the second resistor and the second positive-feedback transconductor forms an amplifier controlled to provide unity open-loop gain. As a result of this, the relevant parallel arrangement is bistable but the control circuit prevents the parallel arrangement from reaching one of the two stable states. The control circuit guarantees a stabilization of the operation of the second parallel arrangement in the transition range between the two stable states, hereinafter referred to as the "operating point". Since the second parallel arrangement in the control circuit is a replica of the first parallel arrangement, the controllable section in the first parallel arrangement is proportionally controlled with the controllable section in the second parallel arrangement. As a result, deviations from a nominal value in the non-controllable section of the second parallel arrangement give rise to corresponding deviations in the controllable sections of the first and second parallel arrangements. Since, in the first parallel arrangement, the value of the first resistor is selected to be a factor k (k>1) smaller than the negative resistance value (or selecting the negative resistance value in the first parallel arrangement a factor k larger), and since the tolerance ranges of the first resistor and the second resistor, just like the tolerance ranges of the transconductances of the first and the second transconductors, are substantially equal in magnitude and direction, a large effective resistance value can be obtained whose tolerance range owing to tolerance range in the positive or negative resistance, will not increase with respect to the tolerance range of the positive or the negative resistance alone.

In a preferred embodiment of an adjustable resistance device in accordance with the invention, the respective positive-feedback transconductors each have a control input for controlling the controllable transconductance, which control inputs constitute the control inputs of the respective resistance devices. As a result, the parallel arrangement comprises a fixed positive and a controllable negative resistance section. This enables the transconductors to be adjusted by means of a simple controllable current source.

A further preferred embodiment of an adjustable resistance device in accordance with the invention is characterized in that the control circuit comprises means for guaranteeing a preferred polarity of the voltage difference between the first and the second node. This measure ensures that the control circuit is always started with a given setting of the operating point. When the second parallel arrangement goes bistable, the voltage across the parallel arrangement can become either positive or negative. For the simplicity of the control circuit and, in particular, the comparator circuit, it is desirable to ensure that the voltage across the second parallel arrangement can become exclusively positive or exclusively negative.

A simple preferred embodiment of such an adjustable resistance device is characterized in that the means for guaranteeing a preferred polarity comprise:

a first differential amplifier having non-inverting and inverting inputs and outputs, of which:
the non-inverting input is coupled to the first node,
the inverting input is coupled to the second node,
a first differential pair comprising a first and a second emitter-coupled transistor with a current source in a common emitter line,
the non-inverting output of the first differential amplifier being coupled to the base of the first transistor,
the inverting output of the first differential amplifier being coupled to the base of the second transistor,
the collector of the second transistor being coupled to the second node.

A further preferred embodiment of an adjustable resistance device can be characterized in that the comparator circuit comprises:

a second differential amplifier having non-inverting and inverting inputs and non-inverting and inverting outputs, of which second differential amplifier:
the non-inverting input is coupled to the first node via a reference voltage source,
the inverting input is coupled to the second node,
a second differential pair comprising a third and a fourth emitter-coupled transistor with a further current source in a common emitter line,
the non-inverting output of the second differential amplifier being coupled to the base of the third transistor,
the inverting output of the second differential amplifier being coupled to the base of the fourth transistor,
the collector of the third transistor being coupled to the collector and the base of a first current source transistor, whose base forms the output of the comparator circuit.

In a simple embodiment of the invention, which is less sensitive to common-mode interference, the transconductors are symmetrical and this embodiment is characterized in that the first transconductor and the second transconductor each have an input and an output with a non-inverting and an inverting signal terminal, and in that each of said transconductors comprises:

fifth and sixth emitter-coupled transistors, having their common emitter line coupled to the collector of a second current source transistor, the base of this current source transistor forming the control input of the transconductor,
the base of the fifth and the base of the sixth transistor forming the non-inverting and the inverting input terminal, respectively,
the collector of the sixth and the collector of the fifth transistor forming the non-inverting and the inverting output terminal, respectively.

Another embodiment of the adjustable resistance device in accordance with the invention is characterized in that the respective resistors have a control input for controlling the controllable resistance value, which control input forms the control input of the respective resistance device. When this step is used, the negative resistance is fixed and the positive resistance is selected to be variable.

The invention is of particular advantage in a resonance amplifier as known from U.S. Pat. No. 5,220,686. In accordance with the present invention, such a resonance amplifier, which comprises:

a first adjustable resistance device comprising a first parallel arrangement of a first resistor and a first positive-feedback transconductor, which parallel arrangement has a control input,
a second adjustable resistance device comprising a third parallel arrangement of a third resistor and a third positive-feedback transconductor, which parallel arrangement has a control input,
first and second capacitors, arranged in parallel with the first and the third parallel arrangement,
a fourth transconductor having an output coupled to the third parallel arrangement and having an input coupled to the first parallel arrangement,
a fifth transconductor having an output coupled to the input of the fourth transconductor and having an input coupled to the output of the fourth transconductor via a signal inverter, is characterized in that
the control inputs of the first and the third parallel arrangement are coupled to the output of a common control circuit,
the control circuit comprises a control loop which includes:
arranged between a first node and a second node, a second parallel arrangement of a second resistor and a second positive-feedback transconductor, which second parallel arrangement has a control input,
a sixth transconductor having an output coupled to the supply line and having an input arranged in parallel with the input of the transconductor,
a comparator circuit having a first and a second input coupled to the first and the second node, respectively, and having an output which forms the output of the control circuit and which is also coupled to the control input of the second parallel arrangement,
the second parallel arrangement differs from the first and the third parallel arrangement in at least one of the following aspects:
the first and the third resistor is smaller in value than the second resistor,
the transconductance of the first and the third transconductor is smaller than the transconductance of the second transconductor.

The resonance amplifier can be used as a band-pass filter. The use of the invention enables very high quality factors to be realized. Since the resonance amplifier comprises two symmetrical sections, each including an adjustable resistance device, the control circuits of these resistance devices can be combined into a single control circuit. This has the advantage that less components are required. The input resistance of the fourth transconductor and the fifth transconductor form a first and a second load, respectively, parallel to the first and the third parallel arrangements, respectively. For a correct operation of the invention, the second parallel arrangement in the control circuit should also be coupled to such a load in order to enable compensation for the first and the second loads. This is achieved by including a sixth transconductor in the control circuit, which transconductor has its input arranged in parallel with the input of the second transconductor.

In accordance with a further aspect of the invention such a resonance amplifier can be used to advantage in a receiver successively comprising a selectivity stage, a demodulation device and a low frequency (LF) section. According to the invention, such a receiver is characterized in that the selectivity stage includes a resonance amplifier as noted above. This is based on the recognition of the fact that such a resonance amplifier can be used advantageously particularly in the selectivity stage because this stage uses band-pass filters with high quality factors, as a result of which, they are more susceptible to expansion of the resistance tolerance range, which band-pass filters are frequently implemented by means of discrete components. The use of the step in accordance with the invention enables these band-pass filters to be fully integrated without any external adjustments.

Another preferred embodiment of such a receiver is characterized in that the fourth, the fifth and the sixth transconductors each have a control input for controlling the controllable transconductance, which control inputs are coupled to a common tuning control signal generation circuit. This step provides a tunable band-pass filter which can be used in receivers requiting a band-pass filter with varying tuning frequency, to allow tracking of the tuning frequency with, for example, the modulation. Since the load formed by the fourth transconductor and the fifth transconductor, respectively, now depends on the tuning frequency, the corresponding load in the control circuit, formed by the sixth transconductor, should be controlled accordingly. This is achieved by also coupling the control input of the sixth transconductor to the common control signal generation circuit.

BRIEF DESCRIPTION OF THE DRAWINGS

The invention will now be described in more detail with reference to the drawings, in which corresponding elements bear the same reference symbols. In the drawings.

DESCRIPTION OF THE PREFERRED EMBODIMENTS

Figures 1A, 1B:
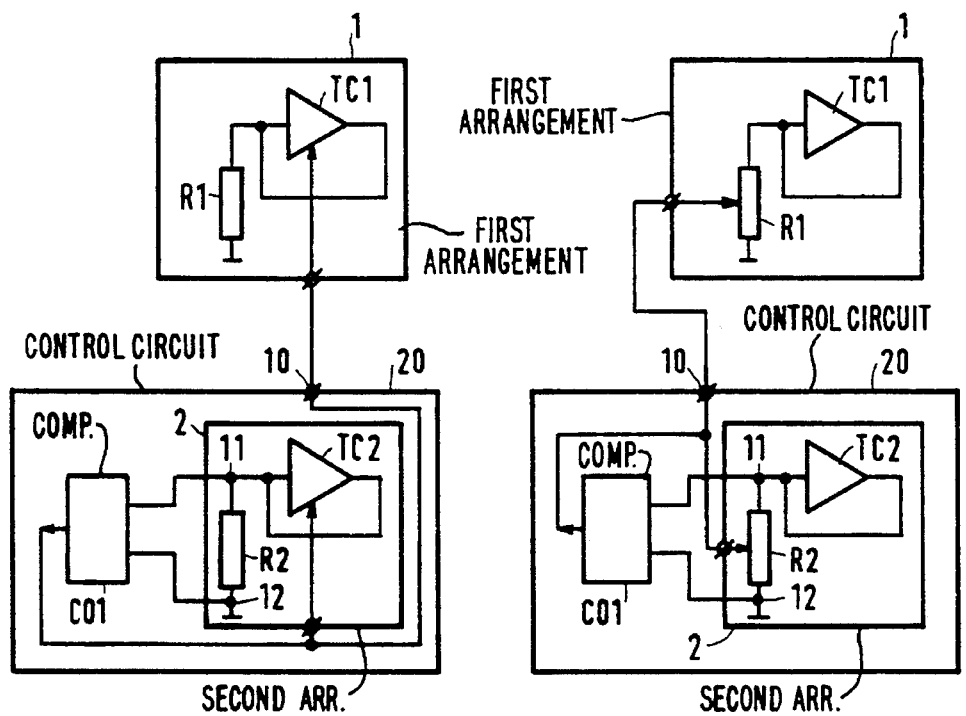
FIGS. 1A and 1B show two embodiments of an adjustable resistance device in accordance with the invention.

FIGS. 1A and 1B show two embodiments of an adjustable resistance device in accordance with the invention.

In both embodiments, an adjustable resistance device comprises a first parallel arrangement 1 of a first resistor R1 and a first positive-feedback transconductor TC1, which parallel arrangement has a control input coupled to an output 10 of a control circuit 20. As a result of the positive feedback, the transconductor TC1 constitutes a negative resistance arranged in parallel with the first resistor R1. By arranging a negative resistance in parallel with a positive resistance, it is possible to obtain an effective resistance which is many times as large as the resistance value of R1.

The control circuit 20 comprises a control loop which includes:

arranged between a first node 11 and a second node 12, a second parallel arrangement 2 of a second resistor R2 and a second positive-feedback transconductor TC2, which second parallel arrangement has a control input and corresponds to the first parallel arrangement, a comparator circuit CO1 having a first and a second input coupled to the first node 11 and the second node 12, respectively, and having an output which forms the output 10 of the control circuit 20 and which is also coupled to the control input of the second parallel arrangement 2. The second parallel arrangement 2 differs from the first parallel arrangement 1 in at least one of the following aspects:

the first resistor R1 is smaller in value than the second resistor R2, the transconductance of the first transconductor TC1 is smaller than the transconductance of the second transconductor TC2.

In FIG. 1A, the resistors R1 and R2 are fixed and the transconductances of TC1 and TC2 are selected to be variable. As a result, each of the parallel arrangements comprises a fixed positive section and a variable negative resistance section. In FIG. 1B, the resistors R1 and R2 are variable and the transconductances of TC1 and TC2 are fixed. A variable resistance can be formed by, for example, a metal oxide semiconductor transistor. However, for the operation of the invention, this is irrelevant. The operation will be explained with reference to FIG. 1A, in which the positive resistor R1 is fixed and the negative resistance is variable.

The control circuit 20 makes use of the fact that the parallel arrangement of the second resistor R2 and the second transconductor TC2 forms a positive-feedback amplifier. If the open-loop gain of this amplifier is substantially unity, the feedback amplifier will become bistable and a voltage will appear at the output. As the gain increases, for example, because the transconductance of the transconductor TC2 increases, the output voltage will be limited to the maximum output voltage of the feedback amplifier. In the transition range, in which the output voltage increases with increasing transconductance, the open-loop gain is substantially unity. The voltage between the nodes 11 and 12 is measured by a comparator circuit CO1, which compares this voltage with a reference voltage. This reference voltage is non-critical provided that it is smaller than the maximum output voltage of the feedback amplifier formed by R2 and TC2. The control loop now acts in such a manner that if the voltage between the nodes 11 and 12 is smaller than the reference voltage, the transconductance of TC2 is increased by the comparator circuit CO1 until this voltage is equal to the reference voltage. If the voltage is larger than the reference voltage, the comparator circuit CO1 will reduce the transconductance of TC2 until the voltage is equal to the reference voltage. This entails that the parallel arrangement of R2 and TC2 is set to the operating point, which means that the negative resistance formed by TC2 is controlled to remain equal to the positive resistance R2. As a result of this, the variation in the positive resistance R2, for example, owing to unit deviations and/or process tolerance ranges, automatically results in a similar variation in said negative resistance. The first parallel arrangement includes a similar resistor and transconductor, i.e., the resistor R1 and transconductor TC1, the transconductance of TC1 being controlled in proportion to the transconductance of TC2. The open-loop gain of the amplifier comprising R1 and TC1 is selected to be a factor k (k>1) smaller than 1. The tolerance ranges of these components in an integrated circuit will be substantially equal in magnitude and direction. Since the factor k is determined by a difference in tolerance range between components, which difference is very small in an integrated circuit, the tolerance range of the resulting effective resistance value of the parallel arrangement of R1 and TC1 owing to the parallel connection, which resistance value has become a factor M=k/(k−1) larger than the value of the resistor R1, will not have become larger than the tolerance range of the resistance value of R1. The factor k is a degree of freedom which enables the resistance value of the adjustable resistance device to be dimensioned. The factor k can be realized, for example, by making the resistance of R1 a factor k smaller than the resistance of R2 or by making the transconductance of TC1 a factor k smaller than the transconductance of TC2. This can be achieved in that in the layout of the first parallel arrangement, the dimensions of the first resistor R1 or the current source transistor CT1 or the transistors T5, T6 defining the transconductance of TC1 are selected to be smaller than those of the corresponding components in the second parallel arrangement. The factor k can also be realized, for example, by attenuating the control signal to the first parallel arrangement.

Figure 2:
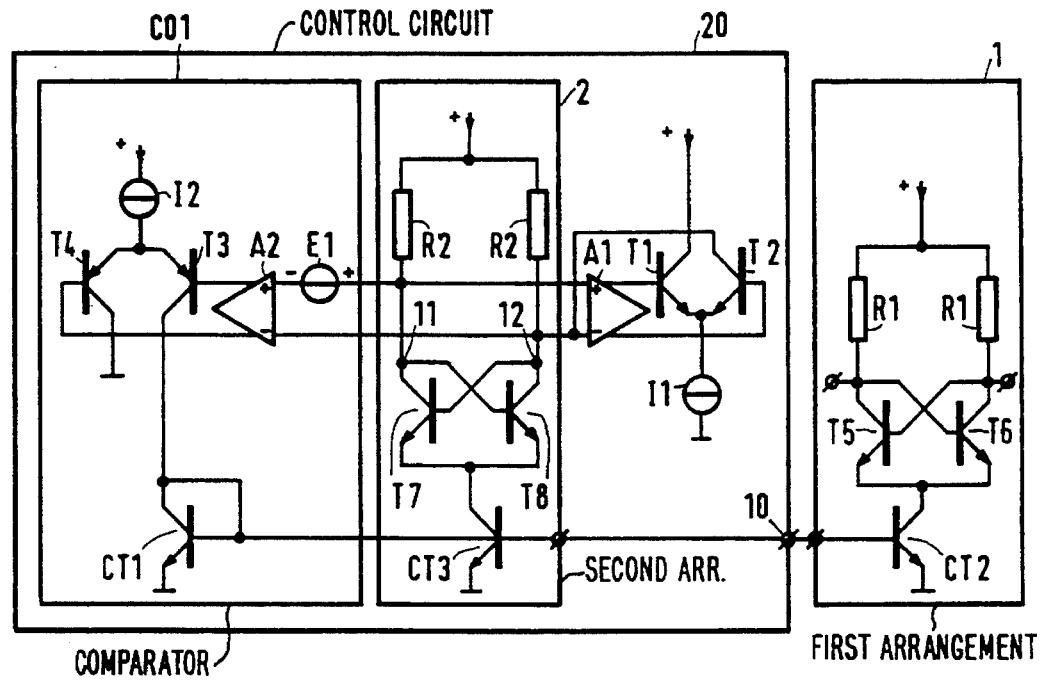
FIG. 2 shows a version of an adjustable resistance device in accordance with the invention.

FIG. 2 shows a symmetrical practical version of an adjustable resistance device in accordance with the invention. The transconductor TC1 of FIG. 1 is now implemented as an emitter-coupled differential pair, comprising the transistors T5 and T6, having their common emitter line coupled to the collector of a current source transistor CT2, whose base forms the control input of the transconductor TC1 and is connected to the output 10 of the control circuit 20. The collector of T5 and the collector of T6 are coupled to the base of T6 and the base of T5, respectively. The collectors of T5 and T6 are coupled to a supply line via respective equal collector resistors R1. As a result of the symmetry of the transconductor TC1, the resistor R1 of FIG. 1 is now also symmetrical. The parallel arrangement of R2 and TC2 in FIG. 1 is implemented by means of transistors T7 and T8, collector resistors R2 and a current source transistor CT3, arranged in the same way as T5, T6, R1 and CT2. The base of the current source transistor CT3 now constitutes the control input of the transconductor TC2 formed by T7, T8 and CT3, and is coupled to the output 10 of the control circuit 20. The collector of T7 and the collector of T8 are coupled to the nodes 11 and 12, respectively.

Turn-on transients may give rise to a voltage difference between the first and the second node, which voltage difference can also be negative. This may lead to positive feedback of the signal in the control loop, as a result of which the control loop assumes an undesired stable state. This is precluded by adapting the comparator circuit in such a manner that the sign of the input voltage is independent of the output signal of the comparator circuit CO1. This can be achieved, for example, by rectifying or squaring the input voltage of CO1. Another possibility is to ensure that the voltage between the first and the second node can have only one polarity. This can be achieved inter alia by making the second parallel arrangement asymmetrical, so that the voltage between the first and the second node will have a preferred polarity. This is possible, for example, by giving the two collector resistors R2 mutually different values or by making, for example, the transistor T7 slightly larger than the transistor T8. A variant of this is obtained by providing the control circuit with means for guaranteeing a preferred polarity of the voltage between the first and the second node. This variant is to be preferred because the comparator circuit CO1 then remains simple and the second parallel arrangement remains symmetrical. The means for guaranteeing a preferred polarity comprise:

a first differential amplifier A1 having non-inverting and inverting inputs and outputs, of which:
the non-inverting input is coupled to the first node 11,
the inverting input is coupled to the second node 12,
a first differential pair comprising first and second emitter-coupled transistors T1, T2 with a current source I1 in a common emitter line,
the non-inverting output of the first differential amplifier A1 being coupled to the base of the first transistor T1,
the inverting output of the first differential amplifier A1 being coupled to the base of the second transistor T2,
the collector of the second transistor T2 being coupled to the second node 12.

In the desired state, the input voltage of the differential amplifier A1 is positive, the transistor T1 will carry current and the transistor T2 will not carry current, so that no current will be drawn from the control loop via the transistor T2. If the input voltage is now smaller than zero, which may happen, for example, upon starting, the transistor T1 will not carry current and the transistor T2 will carry current. This current should be supplied via the collector resistor R2, which is coupled to the node 12, so that the voltage on the collector of the eighth transistor T8 will decrease. If the current is large enough, the voltage will decrease below the level of the collector of the transistor T7. As a result of this, the input voltage of the differential amplifier A1 becomes positive again, the control loop has assumed the desired state and the transistor T2 becomes currentless.

The comparator circuit CO1 in FIG. 2 comprises:
a second differential amplifier A2 having non-inverting and inverting inputs and non-inverting and inverting outputs, of which second differential amplifier A2:
the non-inverting input is coupled to the first node 11 via a reference voltage source E1,
the inverting input is coupled to the second node 12,
a second differential pair comprising third and fourth emitter-coupled transistors T3, T4 with a further current source I2 in a common emitter line,
the non-inverting output of the second differential amplifier A2 being coupled to the base of the third transistor T3,
the inverting output of the second differential amplifier A2 being coupled to the base of the fourth transistor T4,
the collector of the third transistor T3 being coupled to the collector and the base of a first current source transistor CT1, whose base forms the output of the comparator circuit CO1.

A positive difference voltage at the input of the differential amplifier A2 indicates that the output voltage of the differential pair T7, T8 is smaller than the reference voltage from El. As a result of the coupling of the outputs of the differential amplifier A2 to the inputs of the differential pair T3, T4, this means that the current in the transistor T4 will increase relative to that in T3, which results in an increase of the current through CT1. Owing to the coupling of CT1 to CT3, the current through CT3 will also increase, as a result of which the open-loop gain of the feedback differential amplifier T7, T8 increases until the operating point of the differential amplifier T7, T8 is reached and the output voltage of the differential pair T7, T8 increases and becomes equal to the reference voltage from E1. A negative difference voltage at the input of the differential amplifier A2 indicates that the output voltage of the differential pair T7, T8 is larger than the reference voltage of E1. This will result in a decrease of the open-loop gain of the differential pair T7, T8, so that the output voltage of the differential pair T7, T8 decreases until it is equal to the reference voltage from E1. The output voltage of the differential pair T7, T8 is thus controlled to the value of the reference voltage source E1.

In the present example, the current source transistor CT1 forms the input of a current mirror bank whose outputs are formed by the collectors of the current source transistors CT2 and CT3, which guarantees a high degree of equality between the collector currents of the second and third current source transistors.

Figure 3:
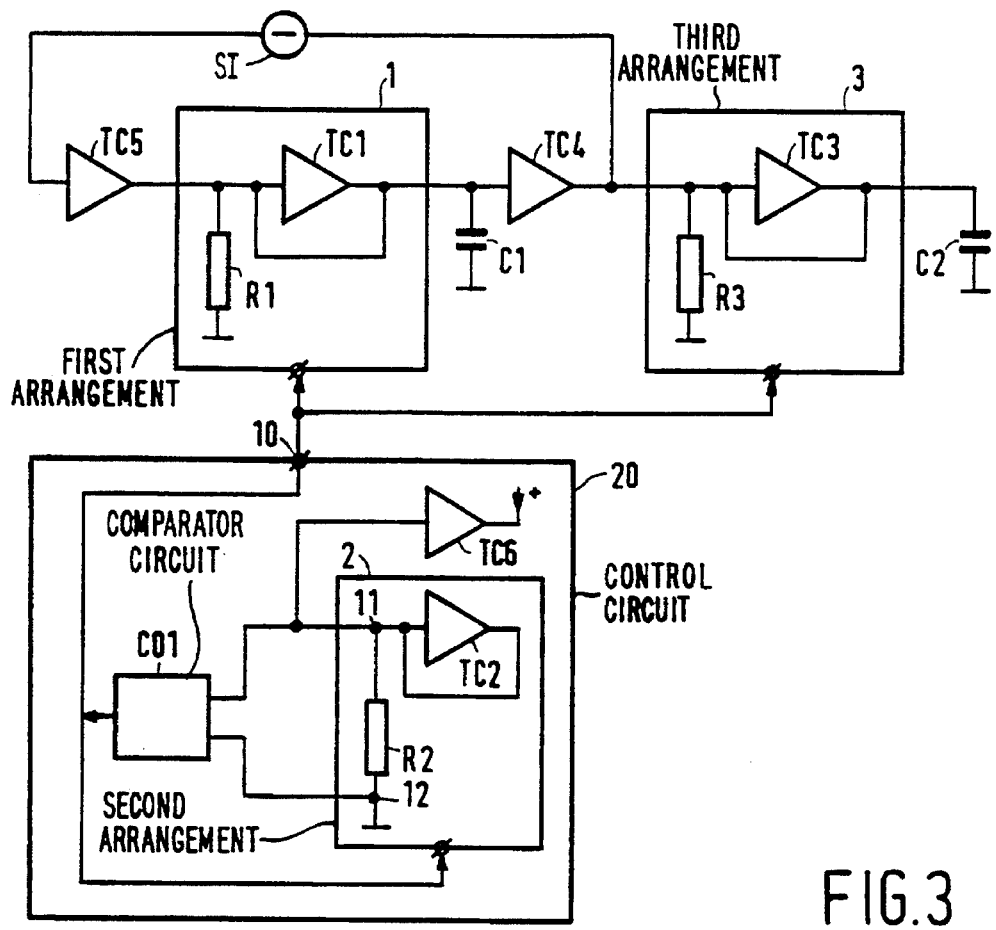
FIG. 3 shows a resonance amplifier in accordance with the invention.

FIG. 3 shows a resonance amplifier in accordance with the invention, comprising:

- a first adjustable resistance device comprising a first parallel arrangement 1 of a first resistor R1 and a first positive-feedback transconductor TC1, which parallel arrangement has a control input,
- a second adjustable resistance device comprising a third parallel arrangement 3 of a third resistor R3 and a third positive-feedback transconductor TC3, which parallel arrangement has a control input,
- first and second capacitors C1 and C2, arranged in parallel with the first parallel arrangement 1 and the third parallel arrangements 3, respectively,
- a fourth transconductor TC4 having an output coupled to the third parallel arrangement 3 and having an input coupled to the first parallel arrangement 1,
- a fifth transconductor TC5 having an output coupled to the input of the fourth transconductor TC4 and having an input coupled to the output of the fourth transconductor TC4 via a signal inverter SI.

Preferably, the resonance amplifier comprises two identical sections. This has the advantage that the control circuits for the first and the second adjustable resistance devices can be combined to form a common control circuit 20, as shown in FIG. 3. To this end, the control inputs of the first and the third parallel arrangements 1, 3 are coupled to the output 10 of the common control circuit 20, which is further identical to that shown in FIGS. 1A and 1B. For a correct understanding of the present invention, a further explanation of the operation of the actual resonance amplifier is not necessary and reference is made to U.S. Pat. No. 5,220,686.

Since the input resistance of the fourth transconductor and of the fifth transconductor forms an additional load parallel to the first and the third parallel arrangements, respectively, the ratio between the positive and the negative resistance values in the resonance amplifier will no longer be correct. For a correct operation of the resonance amplifier in accordance with the invention, the parallel arrangement 2 in the control circuit 20 should also include such an additional load. This is achieved by means of the transconductor TC6, whose input is arranged in parallel with the input of the transconductor TC2.

The second parallel arrangement 2 differs from the first and the third parallel arrangements 1, 3 in at least one of the following aspects:

- the first and the third resistor R1, R3 are smaller in value than the second resistor R2,
- the transconductances of the first and the third transconductor TC1, TC3 are smaller than the transconductance of the second transconductor TC2.

Figure 4:
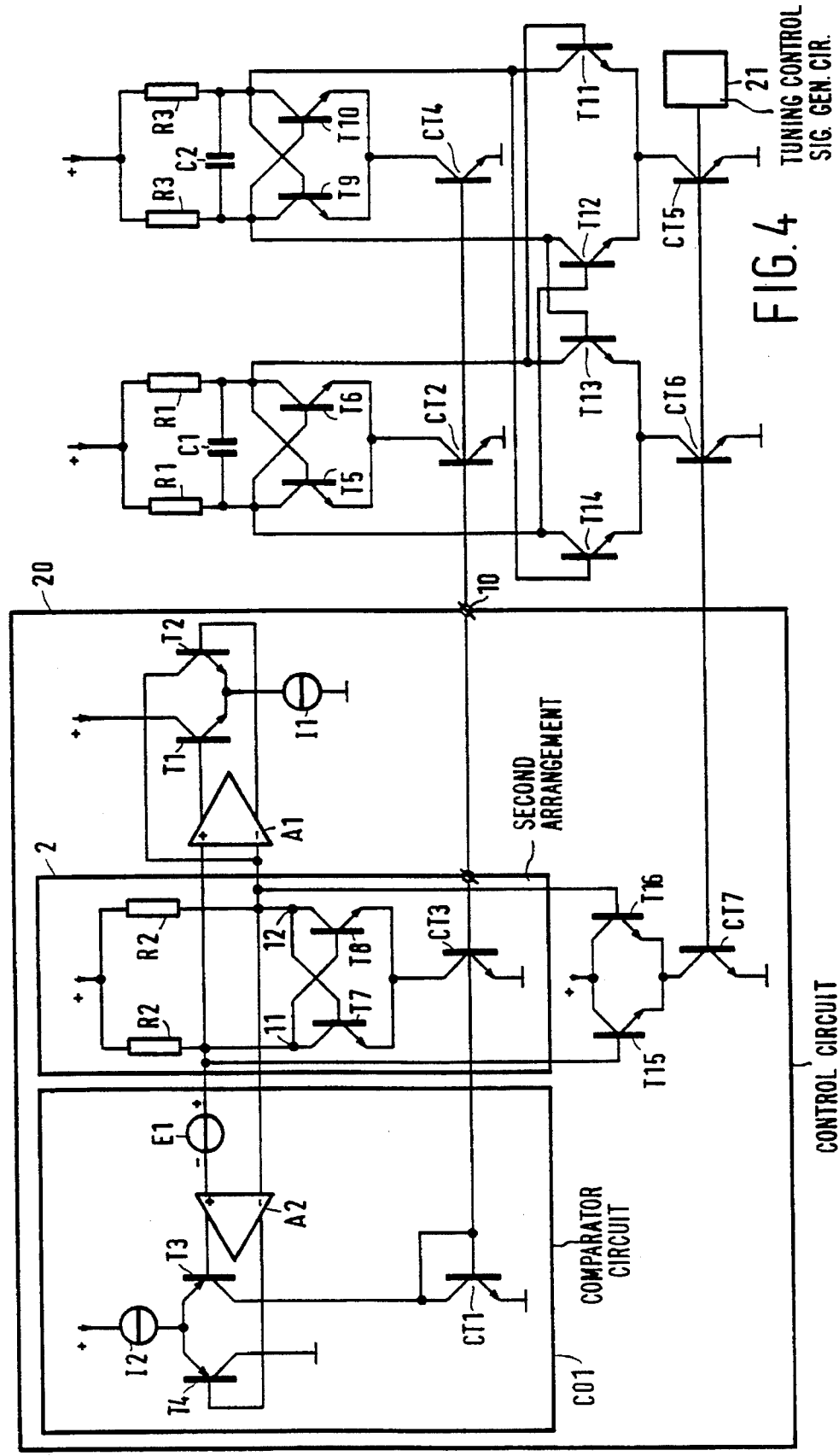
FIG. 4 shows a symmetrical practical version of a tunable resonance amplifier for use in a receiver in accordance with the invention.

FIG. 4 shows a practical version of a tunable resonance amplifier for use in a receiver in accordance with the invention, which version is suitable for implementation as an integrated circuit. The resonance amplifier comprises two identical adjustable resistance devices. The first resistance device comprises transistors T5, T6, a current source transistor CT2, and collector resistors R1, arranged as shown in FIG. 2, with a capacitor C1 coupled between the collectors of the transistors T5 and T6. The third resistance device comprises ninth and tenth transistors T9, T10, a fourth current source transistor CT4, two collector resistors R3, and a second capacitor C2, coupled to one another in the same way as T5, T6, CT2, R1 and C1 in the first resistance device. In the present embodiment, the resonance amplifier also comprises sixth and seventh emitter-coupled differential pairs comprising eleventh to fourteenth transistors T11 to T14, respectively. The emitter tails of the sixth and seventh differential pairs T11, T12 and T13, T14 include current source transistors CT5 and CT6. Thus, the sixth and seventh differential pairs with the current source transistors CT5 and CT6 form the transconductors TC5 and TC4. The bases of CT5 and CT6 are connected to a common tuning control generation circuit 21. The base of T11 is connected to the collector of T6 and the collector of T13. The base of T12 is connected to the collector of T5 and the collector of T14. The collector of T11 is connected to the base of T14 and the collector of T10. The collector of T12 is connected to the base of T13 and the collector of T9. For the operation of the resonance amplifier, reference is made to U.S. Pat. No. 5,220,686.

The control circuit 20 in FIG. 4 comprises the same components as in FIG. 2. The control circuit 20 in addition comprises the eighth differential pair T15, T16 having their common emitter line connected to a seventh current source transistor CT7, whose base is coupled to the tuning control signal generation circuit 21. This eighth differential pair with the current source transistor CT7 forms the transconductor TC6 of FIG. 3. The bases of T15 and T16 are coupled to the first (11) and the second (12) node, respectively. The collectors of T15 and T16 are coupled to the supply line.

The resonance amplifier uses identical structures, which is advantageous in the case of integration.

Figure 5:
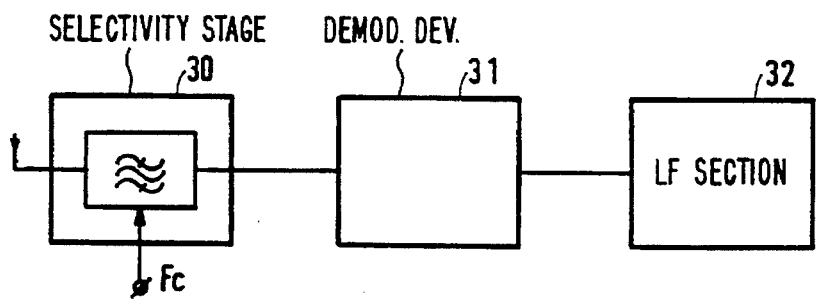
FIGS. 5 and 6 show two variants of a receiver including a resonance amplifier in accordance with the invention.
Figure 6:
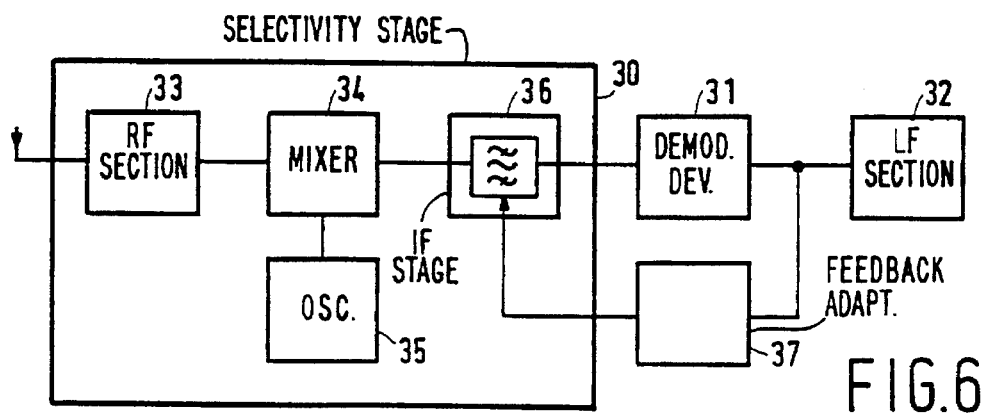

FIGS. 5 and 6 show two variants of a receiver in accordance with the invention, provided with a resonance amplifier. The receiver comprises a selectivity stage 30, a demodulation device 31, followed by an LF section 32.

In FIG. 5 the resonance amplifier in accordance with the invention is included in the selectivity stage 30 so that a simple straightforward AM receiver can be realized, which is tunable by varying the tuning frequency Fc of the resonance amplifier. For this purpose, it is important to have a high and accurate quality factor in the selectivity stage 30 in view of the comparatively small bandwidth used for amplitude modulated (AM) signals. The demodulation device 31 should then cover all the frequencies that can be selected by the selectivity stage 30.

In FIG. 6 the selectivity stage 30 comprises an radio frequency (RF) section 33, a mixer stage 34, a tuning oscillator 35, and an intermediate frequency (IF) section 36 for use in a superheterodyne receiver. In the present case, the tunable band-pass filter is included in the IF section 36 and the tuning frequency of the resonance amplifier tracks the modulation signal, so that with substantially the same distortion, the bandwidth of the resonance amplifier can be substantially smaller than possible in a receiver with a fixed band-pass filter. The feedback loop for the tracking between the modulation signal and the tuning frequency of the resonance amplifier includes a circuit 37 which enables the degree of feedback to be adapted.

The invention is not limited to the exemplary embodiments disclosed herein.

It is possible, for example, to realize the means for guaranteeing a preferred polarity of a voltage between the first and the second node 11, 12 in another manner than shown. In principle, the current source I1 may also be coupled directly to the second node 12 without the use of the differential amplifier A1 and the third differential pair. However, this will affect the operation of the control circuit.

The reference voltage source E1 in FIG. 2 may alternatively be coupled to the inverting input of the differential amplifier 12 and the node 12 but with inverted polarity.

In FIG. 5, the selectivity stage 30 may comprise a series arrangement of resonance amplifiers instead of a single resonance amplifier. This also applies to the IF section 36 in FIG. 6, which may also comprise a series arrangement of resonance amplifiers.

Moreover, it will be obvious to those skilled in the art to construct the transconductor in a manner different from that shown in the figures. The literature describes various circuits which can replace the transconductor version shown herein.

It is also possible to replace the transistors by field-effect transistors (FETs) or metal oxide semiconductor (MOS) transistors, in which case collector should read drain, emitter should read source and base should read gate.

We claim:

1. An adjustable resistance device comprising a first arrangement of a first resistor and a first positive-feedback transconductor, and a control circuit, said first arrangement having a control input coupled to an output of said control circuit, characterized in that the control circuit comprises a control loop which includes:

a second arrangement of a second resistor and a second positive-feedback transconductor, said second arrangement being arranged between a first node and a second node, and said second arrangement having a control input; and a comparator circuit having a first and a second input coupled to the first node and the second node, respectively, and having an output which forms the output of the control circuit and which is also coupled to the control input of the second arrangement, the second arrangement differing from the first arrangement in that the first resistor is smaller in value than the second resistor.

2. The adjustable resistance device as claimed in claim 1, characterized in that the first and second positive-feedback transconductors each have a control input for controlling the transconductance, the control inputs of the first and second positive feedback transconductors being coupled to the control inputs of the first and second arrangements, respectively.

3. The adjustable resistance device as claimed in claim 1, characterized in that the control circuit comprises means for setting a predetermined polarity of the voltage difference between the first and the second node.

4. An adjustable resistance device as claimed in claim 3, characterized in that the means for setting a predetermined polarity comprises:

a first differential amplifier having non-inverting and inverting inputs and outputs, the non-inverting input being coupled to the first node, and the inverting input being coupled to the second node; and a first differential pair comprising a first emitter-coupled and a second emitter-coupled transistor, and a current source coupled in common to emitters of both said first and second emitter-coupled transistors, the non-inverting output of the first differential amplifier being coupled to a base of the first emitter-coupled transistor, the inverting output of the first differential amplifier being coupled to a base of the second emitter-coupled transistor, and a collector of the second emitter-coupled transistor being coupled to the second node.

5. The adjustable resistance device as claimed in claim 3, characterized in that the comparator circuit comprises:

a second differential amplifier having non-inverting and inverting inputs and non-inverting and inverting outputs, the non-inverting input being coupled to the first node via a reference voltage source, and the inverting input being coupled to the second node; and a second differential pair comprising a third emitter-coupled transistor and a fourth emitter-coupled transistor, and a further current source coupled in common to emitters of both of said third and fourth emitter-coupled transistors, the non-inverting output of the second differential amplifier being coupled to a base of the third emitter-coupled transistor, the inverting output of the second differential amplifier being coupled to a base of the fourth emitter-coupled transistor, and a collector of the third emitter-coupled transistor being coupled to a collector and a base of a first current source transistor, the base of said first current source transistor forming an output of the comparator circuit.

6. The adjustable resistance device as claimed in claim 2, characterized in that the first transconductor and the second transconductor each have an input and an output with a non-inverting and an inverting signal terminal, and in that each of said first and second transconductors comprises:

fifth and sixth emitter-coupled transistors having emitters coupled in common to a collector of a second current source transistor, a base of second current source transistor forming the control input of the transconductor, a base of the fifth emitter-coupled transistor and a base of the sixth emitter-coupled transistor forming the non-inverting input terminal and the inverting input terminal, respectively, a collector of the sixth emitter-coupled transistor and a collector of the fifth emitter-coupled transistor forming the non-inverting output terminal and the inverting output terminal, respectively.

7. The adjustable resistance device as claimed in claim 1, characterized in that the first and second resistors each has a control input for controlling a resistance value, the control inputs of said first and second resistors forming the control inputs of the respective first and second arrangements.

8. A resonance amplifier comprising:

a first adjustable resistance device comprising a first arrangement of a first resistor and a first positive-feedback transconductor, said first arrangement having a control input;

a second adjustable resistance device comprising a third arrangement of a third resistor and a third positive-feedback transconductor, said third arrangement having a control input;

first and second capacitors, arranged in parallel with the first and the third arrangements;

a fourth transconductor having an output coupled to the third arrangement and having an input coupled to the first arrangement; and a fifth transconductor having an output coupled to the input of the fourth transconductor and having an input coupled to the output of the fourth transconductor via a signal inverter, characterized in that the resonance amplifier further comprises a common control circuit having an output coupled to the control inputs of the first arrangement and the third parallel arrangement, the common control circuit comprising a control loop which includes:

a second arrangement of a second resistor and a second positive-feedback transconductor, said second arrangement being arranged between a first node and a second node, and having a control input;

a sixth transconductor having an output coupled to a supply line and having an input arranged in parallel with the input of the second positive-feedback transconductor;

a comparator circuit having a first and a second input coupled to the first node and the second node, respectively, and having an output which forms the output of the common control circuit and which is also coupled to the control input of the second arrangement, the second parallel arrangement differing from the first arrangement and the third arrangement in that the first resistor and the third resistor are smaller in value than the second resistor.

9. A receiver successively comprising a selectivity stage, a demodulation device and an LF section, characterized in that the selectivity stage comprises a resonance amplifier comprising:

a first adjustable resistance device comprising a first arrangement of a first resistor and a first positive-feedback transconductor, said first arrangement having a control input;

a second adjustable resistance device comprising a third arrangement of a third resistor and a third positive-feedback transconductor, said third arrangement having a control input;

first and second capacitors, arranged in parallel with the first and the third arrangements;

a fourth transconductor having an output coupled to the third arrangement and having an input coupled to the first arrangement; and a fifth transconductor having an output coupled to the input of the fourth transconductor and having an input coupled to the output of the fourth transconductor via a signal inverter, wherein the resonance amplifier further comprises a common control circuit having an output coupled to the control inputs of the first arrangement and the third parallel arrangement, the common control circuit comprising a control loop which includes:

a second arrangement of a second resistor and a second positive-feedback transconductor, said second arrangement being arranged between a first node and a second node, and having a control input;

a sixth transconductor having an output coupled to a supply line and having an input arranged in parallel with the input of the second positive-feedback transconductor;

a comparator circuit having a first and a second input coupled to the first node and the second node, respectively, and having an output which forms the output of the common control circuit and which is also coupled to the control input of the second arrangement, the second parallel arrangement differing from the first arrangement and the third arrangement in that the first resistor and the third resistor are smaller in value than the second resistor.

10. The receiver as claimed in claim 9, characterized in that the fourth, the fifth and the sixth transconductors each have a control input for controlling the transconductance, the control inputs of said fourth, fifth and sixth transconductors being coupled to a common tuning control signal generation circuit.

11. An adjustable resistance device comprising a first arrangement of a first resistor and a first positive-feedback transconductor, and a control circuit, said first arrangement having a control input coupled to an output of said control circuit, characterized in that the control circuit comprises a control loop which includes:

a second arrangement of a second resistor and a second positive-feedback transconductor, said second arrangement being arranged between a first node and a second node, and said second arrangement having a control input; and a comparator circuit having a first and a second input coupled to the first node and the second node, respectively, and having an output which forms the output of the control circuit and which is also coupled to the control input of the second arrangement, the second arrangement differing from the first arrangement in that the transconductance of the first transconductor is smaller than the transconductance of the second transconductor.

12. The adjustable resistance device as claimed in claim 11, characterized in that the first and second positive-feedback transconductors each have a control input for controlling the transconductance, the control inputs of the first and second positive-feedback transconductors being coupled to the control inputs of the first and second arrangements, respectively.

13. The adjustable resistance device as claimed in claim 11, characterized in that the control circuit comprises means for setting a predetermined polarity of the voltage difference between the first and the second node.

14. An adjustable resistance device as claimed in claim 13, characterized in that the means for setting a predetermined polarity comprises:

a first differential amplifier having non-inverting and inverting inputs and outputs, the non-inverting input being coupled to the first node, and the inverting input being coupled to the second node; and a first differential pair comprising a first emitter-coupled and a second emitter-coupled transistor, and a current source coupled in common to emitters of both said first and second emitter-coupled transistors, the non-inverting output of the first differential amplifier being coupled to a base of the first emitter-coupled transistor, the inverting output of the first differential amplifier being coupled to a base of the second emitter-coupled transistor, and a collector of the second emitter-coupled transistor being coupled to the second node.

15. The adjustable resistance device as claimed in claim 13, characterized in that the comparator circuit comprises:

a second differential amplifier having non-inverting and inverting inputs and non-inverting and inverting outputs, the non-inverting input being coupled to the first node via a reference voltage source, and the inverting input being coupled to the second node; and a second differential pair comprising a third emitter-coupled transistor and a fourth emitter-coupled transistor, and a further current source coupled in common to emitters of both of said third and fourth emitter-coupled transistors, the non-inverting output of the second differential amplifier being coupled to a base of the third emitter-coupled transistor, the inverting output of the second differential amplifier being coupled to a base of the fourth emitter-coupled transistor, and a collector of the third emitter-coupled transistor being coupled to a collector and a base of a first current source transistor, the base of said first current source transistor forming an output of the comparator circuit.

16. The adjustable resistance device as claimed in claim 12, characterized in that the first transconductor and the second transconductor each have an input and an output with a non-inverting and an inverting signal terminal, and in that each of said first and second transconductors comprises:

fifth and sixth emitter-coupled transistors having emitters coupled in common to a collector of a second current source transistor, a base of second current source transistor forming the control input of the transconductor, a base of the fifth emitter-coupled transistor and a base of the sixth emitter-coupled transistor forming the non-inverting input terminal and the inverting input terminal, respectively, a collector of the sixth emitter-coupled transistor and a collector of the fifth emitter-coupled transistor forming the non-inverting output terminal and the inverting output terminal, respectively.

17. The adjustable resistance device as claimed in claim 11, characterized in that the first and second resistors each has a control input for controlling a resistance value, the control inputs of said first and second resistors forming the control inputs of the respective first and second arrangements.

18. A resonance amplifier comprising:

a first adjustable resistance device comprising a first arrangement of a first resistor and a first positive-feedback transconductor, said first arrangement having a control input;

a second adjustable resistance device comprising a third arrangement of a third resistor and a third positive-feedback transconductor, said third arrangement having a control input;

first and second capacitors, arranged in parallel with the first and the third arrangements;

a fourth transconductor having an output coupled to the third arrangement and having an input coupled to the first arrangement; and a fifth transconductor having an output coupled to the input of the fourth transconductor and having an input coupled to the output of the fourth transconductor via a signal inverter, characterized in that the resonance amplifier further comprises a common control circuit having an output coupled to the control inputs of the first arrangement and the third parallel arrangement, the common control circuit comprising a control loop which includes:

a second arrangement of a second resistor and a second positive-feedback transconductor, said second arrangement being arranged between a first node and a second node, and having a control input;

a sixth transconductor having an output coupled to a supply line and having an input arranged in parallel with the input of the second positive-feedback transconductor;

a comparator circuit having a first and a second input coupled to the first node and the second node, respectively, and having an output which forms the output of the common control circuit and which is also coupled to the control input of the second arrangement, the second parallel arrangement differing from the first arrangement and the third arrangement in that the transconductances of the first transconductor and the third transconductor are smaller than the transconductance of the second transconductor.

19. A receiver successively comprising a selectivity stage, a demodulation device and an LF section, characterized in that the selectivity stage comprises a resonance amplifier comprising:

a first adjustable resistance device comprising a first arrangement of a first resistor and a first positive-feedback transconductor, said first arrangement having a control input;

a second adjustable resistance device comprising a third arrangement of a third resistor and a third positive-feedback transconductor, said third arrangement having a control input;

first and second capacitors, arranged in parallel with the first and the third arrangements;

a fourth transconductor having an output coupled to the third arrangement and having an input coupled to the first arrangement; and a fifth transconductor having an output coupled to the input of the fourth transconductor and having an input coupled to the output of the fourth transconductor via a signal inverter, wherein the resonance amplifier further comprises a common control circuit having an output coupled to the control inputs of the first arrangement and the third parallel arrangement, the common control circuit comprising a control loop which includes:

a second arrangement of a second resistor and a second positive-feedback transconductor, said second arrangement being arranged between a first node and a second node, and having a control input;

a sixth transconductor having an output coupled to a supply line and having an input arranged in parallel with the input of the second positive-feedback transconductor;

a comparator circuit having a first and a second input coupled to the first node and the second node, respectively, and having an output which forms the output of the common control circuit and which is also coupled to the control input of the second arrangement, the second parallel arrangement differing from the first arrangement and the third arrangement in that the transconductances of the first transconductor and the third transconductor are smaller than the transconductance of the second transconductor.

20. The receiver as claimed in claim 19, characterized in that the fourth, the fifth and the sixth transconductors each have a control input for controlling the transconductance, the control inputs of said fourth, fifth and sixth transconductors being coupled to a common tuning control signal generation circuit.

* * * * *